United States Patent
Raguenet

(10) Patent No.: US 10,084,144 B2
(45) Date of Patent: Sep. 25, 2018

(54) SUBSTRATE FOR DEVICE HAVING AN ORGANIC LIGHT-EMITTING DIODE

(71) Applicant: SAINT-GOBAIN GLASS FRANCE, Courbevoie (FR)

(72) Inventor: Bérangère Raguenet, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/770,190

(22) PCT Filed: Feb. 24, 2014

(86) PCT No.: PCT/FR2014/050370
§ 371 (c)(1),
(2) Date: Aug. 25, 2015

(87) PCT Pub. No.: WO2014/128421
PCT Pub. Date: Aug. 28, 2014

(65) Prior Publication Data
US 2016/0013432 A1  Jan. 14, 2016

(30) Foreign Application Priority Data

Feb. 25, 2013 (FR) .................................. 13 51619
Oct. 29, 2013 (FR) .................................. 13 60522

(51) Int. Cl.
| C03C 3/064 | (2006.01) |
| C03C 3/066 | (2006.01) |
| C03C 8/02 | (2006.01) |
| C03C 8/04 | (2006.01) |
| H01L 51/00 | (2006.01) |
| H01L 51/52 | (2006.01) |
| C03C 4/20 | (2006.01) |
| C03C 8/14 | (2006.01) |
| C03C 17/00 | (2006.01) |
| C03C 17/04 | (2006.01) |
| C03C 17/34 | (2006.01) |

(52) U.S. Cl.
CPC .......... *H01L 51/0096* (2013.01); *C03C 3/064* (2013.01); *C03C 3/066* (2013.01); *C03C 4/20* (2013.01); *C03C 8/02* (2013.01); *C03C 8/04* (2013.01); *C03C 8/14* (2013.01); *C03C 17/007* (2013.01); *C03C 17/04* (2013.01); *C03C 17/3417* (2013.01); *H01L 51/5268* (2013.01); *C03C 2217/452* (2013.01); *C03C 2217/475* (2013.01); *C03C 2217/77* (2013.01); *H01L 2251/305* (2013.01); *Y02E 10/549* (2013.01)

(58) Field of Classification Search
None
See application file for complete search history.

(56) References Cited

U.S. PATENT DOCUMENTS

| 6,255,239 | B1 * | 7/2001 | Sakoske ................. C03C 3/064 428/427 |
| 2006/0231803 | A1 * | 10/2006 | Wang ..................... C03C 3/064 252/500 |
| 2007/0224429 | A1 | 9/2007 | Hayakawa et al. |
| 2008/0185962 | A1 | 8/2008 | Kato et al. |
| 2009/0004597 | A1 | 1/2009 | Ueoka et al. |
| 2009/0042715 | A1 | 2/2009 | Uchiyama et al. |
| 2011/0015053 | A1 * | 1/2011 | Hamada ................. C03C 3/064 501/32 |
| 2012/0025245 | A1 | 2/2012 | Nakamura et al. |
| 2012/0155093 | A1 * | 6/2012 | Yamada .............. H01L 51/5275 362/311.01 |
| 2012/0313134 | A1 | 12/2012 | Vermersch et al. |
| 2013/0221336 | A1 * | 8/2013 | Allano .................... C03C 3/066 257/40 |

FOREIGN PATENT DOCUMENTS

| EP | 2168927 A1 * | 3/2010 | ............ C03C 3/066 |
| EP | 2 253 599 A1 | 11/2010 | |
| JP | 2000-211942 A | 8/2000 | |
| JP | 2009-221027 A | 10/2009 | |
| WO | WO 2011/089343 A1 | 7/2011 | |
| WO | WO 2012/017183 A1 | 2/2012 | |
| WO | WO 2012/035565 A1 | 3/2012 | |

OTHER PUBLICATIONS

International Search Report as issued in International Patent Application No. PCT/FR2014/050370, dated Apr. 29, 2014.
Notice of Reasons for Rejection as issued in Japanese Patent Application No. 2015-558532, dated Dec. 5, 2017.

* cited by examiner

*Primary Examiner* — David R Sample
(74) *Attorney, Agent, or Firm* — Pillsbury Winthrop Shaw Pittman LLP

(57) ABSTRACT

A diffusing substrate for a device having an organic light-emitting diode including a sheet of glass coated on one of the surfaces thereof with a layer including a vitreous material, such that the vitreous material has a chemical composition including the following components, which vary within the weight limits defined below:

| | |
|---|---|
| $Bi_2O_3$ | 60-85% |
| $B_2O_3$ | 5-12% |
| $SiO_2$ | 6-20% |
| MgO + ZnO | 0-9.5% |
| $Al_2O_3$ | 0-7% |
| $Li_2O + Na_2O + K_2O$ | 0-5% |
| CaO | 0-5% |
| BaO | 0-20%. |

25 Claims, No Drawings

SUBSTRATE FOR DEVICE HAVING AN ORGANIC LIGHT-EMITTING DIODE

CROSS-REFERENCE TO RELATED APPLICATIONS

This application is the U.S. National Stage of PCT/FR2014/050370, filed Feb. 24, 2014 which in turn claims priority to French patent application number 1351619 filed Feb. 25, 2013 and French patent application number 1360522 filed Oct. 29, 2013. The content of these applications are incorporated herein by reference in their entireties.

The invention relates to the field of, substrates for devices having an organic light-emitting diode. It relates more specifically to chemical compositions of vitreous material and of glass frits which are particularly suitable for the formation of layers.

The devices having an organic light-emitting diode, which will be referred to in the remainder of the text as OLEDs, that are normally used in the art, are devices which emit light by virtue of an electroluminescence phenomenon. These OLED devices generally comprise an organic light-emitting system between two electrodes. One of the electrodes is deposited on a sheet of glass in the form of an electrically conductive electric layer. The OLED devices can be used as visualizing screens or as illuminating devices.

In one application as an illumination device (lamp, etc.), the light extracted from the device is a polychromatic white light. The light extraction efficiency is, however, naturally low, of about 0.25, the light being trapped inside the device owing to the various refractive indices between its various elements.

To solve this problem, it is known practice, for example from application WO 2011/089343, to have, between the sheet of glass (of index 1.5 when it is made of soda-lime-silica glass) and the electrode, an internal scattering layer comprising a vitreous material with a high refractive index (typically between 1.7 and 2.0) and scattering elements, for example particles. The abovementioned application describes vitreous materials of which the chemical composition comprises 40% to 60% by weight of $Bi_2O_3$ and 5% to 30% by weight of ZnO.

The vitreous materials are generally obtained by means of a process in which a glass frit (having the same chemical composition as the material) and a typically organic medium are mixed so as to form a paste, which is deposited on the sheet of glass before firing it.

The glass transition temperature of the glass frit must be sufficiently low in order to be able to fire at temperatures at which the sheet of glass cannot deform. At the same time, the frit must not crystallize (devitrify) during the firing, which would have the effect of generating excessive roughness and also a high optical absorption.

The linear thermal expansion coefficient of the frit must also be suitable for that of the sheet of glass, generally must be close to the latter, or slightly lower, in order to avoid during cooling the occurrence in the vitreous material of mechanical stresses capable of damaging it.

In order to avoid depositing dust on the layer, capable of creating a short circuit, it is common practice to carry out a thorough cleaning of the layer before the deposition of the electrically conductive layer. This cleaning generally implements passes through ultrasonic tanks where the layer is subjected to the action of successively basic detergents (to detach the particles that have remained on the surface) and acidic detergents (in order to neutralize the surface of the layer and to prevent any redepositing of particles). The acid attack is capable of degrading the vitreous material, creating surface roughness unacceptable for the final application.

The objective of the invention is to provide compositions of vitreous material (and of glass frit) which have a good compromise between improved chemical resistance, in particular to acids, a high refractive index, a suitable thermal expansion coefficient and a suitable glass transition temperature, and a low devitrification capacity.

To this effect, a subject of the invention is a scattering substrate for a device having an organic light-emitting diode comprising a sheet of glass coated on one of the faces thereof with a layer comprising a vitreous material, such that said vitreous material has a chemical composition comprising the following constituents, which vary within the weight limits defined hereinafter:

| | |
|---|---|
| $Bi_2O_3$ | 60-85% |
| $B_2O_3$ | 5-12% |
| $SiO_2$ | 6-20% |
| MgO + ZnO | 0-9.5% |
| $Al_2O_3$ | 0-7%, in particular 0-5% |
| $Li_2O$ + $Na_2O$ + $K_2O$ | 0-5% |
| CaO | 0-5% |
| BaO | 0-20%. |

A subject of the invention is also a device having an organic light-emitting diode comprising a scattering substrate according to the invention, wherein an electrically conductive layer is placed on the layer comprising a vitreous material.

The use of the terms "on" or "under" is not necessarily intended to mean that the layers are in contact, only that they are closer to the substrate ("under") or further away ("on"). The case where the layers are in contact is not, however, excluded.

A subject of the invention is also a glass frit of which the chemical composition comprises the following constituents, which vary within the weight limits defined hereinafter:

| | |
|---|---|
| $Bi_2O_3$ | 65-85% |
| $B_2O_3$ | 5-12% |
| $SiO_2$ | 6-20% |
| MgO + ZnO | 0-9.5% |
| $Al_2O_3$ | 0-5% |
| $Li_2O$ + $Na_2O$ + $K_2O$ | 0-5% |
| CaO | 0-5% |
| CaO + MgO | ≥0.5 |
| BaO | 0-20%. |

The preferred characteristics in terms of oxide contents which are described in detail hereinafter relate to both the chemical composition of the vitreous material deposited on the sheet of glass and that of the glass frit (used for the deposition). Throughout the text, the contents indicated are weight contents.

The weight content of $Bi_2O_3$ is advantageously at least 62%, in particular 63% and even 64% or 65% and/or at most 83%, in particular 82%, or even 81%, even 80%, 79% or 78%. It is preferably included in a range of from 65% to 80%, in particular from 68% to 75%. A $Bi_2O_3$ content which is too low does not make it possible to obtain the desired refractive indices, whereas a content which is too high results in unacceptable yellowing of the glass.

The weight content of $B_2O_3$ is preferably at least 6%, in particular 7% or 7.5%, and/or at most 11%, in particular 10%, or even 9.5% or 9%. It is preferably included in a range from 6% to 11%, in particular from 7% to 10%. A high $B_2O_3$ content has the effect of increasing the glass transition temperature and lowering the chemical resistance of the material, while a content that is too low makes the glass more easily devitrifiable.

The weight content of $SiO_2$ is preferably at least 7%, in particular 7.5% or even 8%, and/or at most 18%, 17%, 16%, 15%, 14% or 13%, in particular 12% or 11% and even 10% or 9%. It is preferably included in a range of from 7% to 12%, in particular from 7.5% to 10%. An $SiO_2$ content which is too high leads to a detrimental reduction in the refractive index, while a content that is too low decreases both the chemical resistance and the thermal stability.

The weight content of ZnO is preferably at most 9.5%, in particular 9% or 8%, or even 7% or else 6% or 5%, and even less than 5%. According to one embodiment, the ZnO content is even at most 1%, in particular 0.5%, or 0.1%, or even zero. The weight content of ZnO is preferably included in a range of from 2% to 8%, in particular from 3% to 6%. High ZnO contents go against good chemical resistance, in particular to acids, and increase the risk of devitrification.

The weight content of MgO is preferably at most 3%, in particular 2.5% and even 2%. In certain embodiments, this content is even less than 0.5% and even 0.1%, or even zero. In another embodiment, the MgO content is at least 0.5%, in particular 1%, more particularly included in a range of from 0.5% to 3%, in particular from 1% to 2.5%. The addition of MgO makes it possible to improve the chemical resistance of the vitreous material.

The sum of the weight contents of MgO and ZnO (MgO+ZnO) is advantageously at least 1%, in particular 2% or 3% and even 4% or 5% and/or at most 9%, in particular 8% and even 7%. It is preferably included in a range of from 2% to 9%, in particular from 3% to 8% or from 2% to 5%. It has emerged that too high a cumulative content of MgO and ZnO leads to a risk of devitrification during the manufacturing of the frit.

The weight content of CaO is preferably at most 4% and even 3% or 2%. In certain embodiments, this content is even less than 0.5% and even 0.1%, or even zero. In another embodiment, the CaO content is at least 0.5%, in particular 1%, more particularly included in a range of from 1% to 4%, in particular from 1.5% to 3.5%.

The sum of the weight contents of CaO and MgO is preferably at least 0.5%, in particular 1% or 1.5%, or even 2% or 3%. According to one embodiment, it can, however, be less than 0.5% and even 0.1%, or even zero. The sum of the weight contents of CaO and MgO is preferably included in a range of from 0.5% to 4%. The addition of CaO and/or of MgO, as a supplement to a decrease in the ZnO content, improves the resistance to acids of the vitreous material.

The $Al_2O_3$ content is preferably at least 1%, in particular 2%. It is preferably included in a range of from 1% to 6% or from 1% to 4%, in particular from 2% to 3%. The addition of alumina makes it possible to improve the chemical resistance of the material.

The BaO content is advantageously at most 10%, in particular 5% and even 3% or else 1% or 0.5%, or even 0.1%. It may even be zero.

The total content of alkali metal oxides ($Li_2O$, $Na_2O$, $K_2O$) is preferably at most 3%, in particular 2% and even 1% or 0.5%. According to one preferred embodiment, this content is preferably included in a range of from 0.02% to 1%, in particular from 0.05% to 0.2%. In this case, the only alkali metal oxide present is advantageously $Na_2O$. The addition of alkali metal oxides, even at a low content, has the effect of substantially decreasing the glass transition temperature.

For each of the abovementioned oxides or groups of oxides, each of the lower limits may be combined with each of the upper limits, not all the possible ranges being recalled here in the interests of conciseness. Likewise, each range for a given oxide may be combined with any other range from the other oxides. Here again, not all the combinations may be indicated so as not to needlessly weigh down the present text. Certain preferred combinations are summarized in tables 1 and 2 hereinafter.

TABLE 1

|  | 1 | 2 | 3 | 4 | 5 |
|---|---|---|---|---|---|
| $Bi_2O_3$ | 60-85 | 65-80 | 70-78 | 65-80 | 65-80 |
| $B_2O_3$ | 5-12 | 6-11 | 7-10 | 6-11 | 6-11 |
| $SiO_2$ | 6-20 | 7-12 | 7.5-10 | 7-12 | 7-12 |
| MgO + ZnO | 0-9.5 | 2-9 | 3-8 | 2-5 | 2-9 |
| $Al_2O_3$ | 0-5 | 1-4 | 2-3 | 1-4 | 1-4 |
| $Li_2O + Na_2O + K_2O$ | 0-5 | 0-2 | 0.05-0.2 | 0-2 | 0-2 |
| CaO | 0-5 | 0-3 | 0-2 | 0-3 | 1-4 |
| BaO | 0-20 | 0-5 | 0-1 | 0-5 | 0-5 |

TABLE 2

|  | 6 | 7 | 8 | 9 | 10 |
|---|---|---|---|---|---|
| $Bi_2O_3$ | 60-85 | 65-80 | 70-78 | 65-80 | 65-80 |
| $B_2O_3$ | 5-12 | 6-11 | 7-10 | 6-11 | 6-11 |
| $SiO_2$ | 6-20 | 7-12 | 7.5-10 | 7-12 | 7-12 |
| ZnO | 0-9.5 | 2-8 | 3-6 | 2-8 | 0-1 |
| MgO | 0-3 | 0.5-3 | 1-2.5 | 0-2 | 1-2.5 |
| MgO + ZnO | 0-9.5 | 3-9 |  | 2-9 |  |
| $Al_2O_3$ | 0-5 | 1-4 | 2-3 | 1-4 | 1-4 |
| $Li_2O + Na_2O + K_2O$ | 0-5 | 0-2 | 0.05-0.2 | 0-2 | 0-2 |
| CaO | 0-5 | 0-3 | 0-2 | 1-4 | 0-5 |
| BaO | 0-20 | 0-5 | 0-1 | 0-5 | 0-5 |

Tables 1 and 2 define 10 particularly preferred compositions derived from combinations of ranges previously defined. It goes without saying that each of these ranges may be combined with any other range derived from the tables for the other oxides.

Preferably, the sum of the weight contents of $Bi_2O_3$, $B_2O_3$, $SiO_2$, ZnO, MgO, BaO and CaO is at least 95%, in particular 96% or 97% and even 98% or 99%. Preferably, the sum of the weight contents of $Bi_2O_3$, $B_2O_3$, $SiO_2$, ZnO, MgO and CaO is at least 95%, in particular 96% or 97% and even 98% or 99%.

The total content of $P_2O_5$, $Nb_2O_5$ and $V_2O_5$ is preferably at most 1%, in particular 0.5%, and even zero. The composition is preferably free of lead oxide.

The chemical composition of the vitreous material or of the frit may advantageously comprise the oxides $TiO_2$ and/or $SnO_2$, which have proved to be particularly effective in terms of improving resistance to acids. The $TiO_2$ content is preferably at least 0.5% or 1% and/or at most 5%, in particular 2%. The $SnO_2$ content is preferably at least 0.2% or 0.5% and/or at most 5%, in particular 3% or 2%.

According to another embodiment, the total content of $TiO_2$ and $ZrO_2$ is at most 1%, in particular 0.5% and even 0.1%, or even zero, it being possible for these oxides to have a harmful effect on the devitrification of glasses of this type.

The total content of coloring elements ($Fe_2O_3$, CuO, CoO, $Cr_2O_3$, $MnO_2$, Se, Ag, Cu, Au, $Nd_2O_3$, $Er_2O_3$) is also preferably zero (except for inevitable impurities).

Antimony oxide ($Sb_2O_3$) may be added to the composition in order to reduce the light absorption of the layer, in particular to make it less yellow. The content thereof is preferably at least 1%, in particular 2% and/or at most 5%, in particular 4% or 3%.

The refractive index for a wavelength of 550 nm of the glass constituting the vitreous material or the glass frit is preferably included in a range of from 1.8 to 2.2, in particular from 1.85 to 2.1, and even from 1.88 to 2.0, or even from 1.89 to 1.98.

The glass transition temperature Tg of the glass constituting the vitreous material or the glass frit is preferably included in a range of from 440 to 500° C., in particular from 450 to 480° C. The glass transition temperature is measured by differential scanning calorimetry (DSC), under nitrogen, with a temperature increase rate of 10° C./minute. The beginning of the curve (onset temperature) is considered here for determining the Tg.

The difference between the crystallization temperature Tx and the glass transition temperature Tg is preferably at least 100° C. in order to avoid any devitrification of the vitreous material during the forming thereof. The crystallization temperature is determined by taking into consideration the beginning of the crystallization curve (onset temperature) obtained by differential scanning calorimetry.

The linear thermal expansion coefficient between 20 and 300° C. of the glass constituting the vitreous material or the glass frit is preferably included in a range of from 70 to $100 \times 10^{-7}/°$ C., in particular 75 to $95 \times 10^{-7}/°$ C., and even 80 to $90 \times 10^{-7}/°$ C.

The sheet of glass preferably has a refractive index for a wavelength of 550 nm included in a range of from 1.4 to 1.6. It is preferably a glass of the soda-lime-silica type, obtained by means of the float process, consisting in pouring the molten glass onto a bath of molten tin. The sheet of glass is preferably colorless, and has a light transmittance factor of at least 80%, or even 90% under standard EN 410:1998. The thickness of the sheet of glass is preferably included in a range of from 0.1 to 6 mm, in particular from 0.3 to 3 mm.

The sheet of glass is coated on one of the faces thereof with a layer comprising a vitreous material. Preferably, this layer is deposited in contact with the sheet of glass. Advantageously, the layer coats at least 80%, in particular 90% and even 95% of the surface of the sheet of glass.

According to one embodiment of the invention, the layer advantageously consists of the vitreous material. In this case, and in order to obtain a scattering substrate, it is preferable for the sheet of glass to scatter light (it may in particular be a satin-finish glass, for example given a satin finish by means of an acid treatment), or for a scattering layer to be placed under the layer comprising a vitreous material, in particular in contact with both the sheet of glass and the layer consisting of the vitreous material. The scattering aspect is not therefore obtained by means of the layer itself.

According to another embodiment of the invention, the layer comprising a vitreous material also comprises scattering elements. The layer even advantageously consists of the vitreous material and of the scattering elements. In this embodiment, the layer is itself scattering, and it will be described as a scattering layer.

Preferably, the scattering elements are chosen from particles and cavities. The scattering layer may contain both particles and cavities.

The particles are preferably chosen from alumina particles, zircona particles, silica particles, titanium dioxide particles, calcium carbonate particles and barium sulfate particles. The scattering layer may comprise a single type of particles, or several types of different particles.

The cavities are preferably formed during the firing by elimination of organic compounds, for example of the medium. They are preferably closed and unconnected.

The scattering elements preferably have a characteristic dimension which allows scattering of visible light, in particular between 200 nm and 5 μm. A characteristic dimension may be a median diameter.

The weight concentration of particles in the scattering layer is preferably included in a range of from 0.2% to 10%, in particular from 0.5% to 8%, and even from 0.8% to 5%.

The scattering elements may be distributed homogeneously in the vitreous material. They may alternatively be distributed heterogeneously, by arranging, for example, gradients. The scattering layer may also consist of several elementary layers which differ from one another by virtue of nature, size or different proportions of scattering elements.

The physical thickness of the layer comprising a vitreous material is preferably included in a range of from 0.5 to 100 μm, in particular from 1 to 80 μm and more particularly from 2 to 60 μm, or even from 2 to 30 μm.

Other layers may be placed on the layer comprising a vitreous material, and in particular in contact with said layer.

This may, for example, be a planarization layer, intended to recover any particles located at the surface of the layer comprising a vitreous material, in particular of the scattering layer, so as to reduce the roughness of the latter. The planarization layer may, for example, consist of the vitreous material previously defined, or another vitreous material.

A barrier layer, for example of silica or silicon nitride, the thickness of which is in particular included in a range of from 5 to 30 nm, may be deposited on the layer comprising a vitreous material or the planarization layer, in contact with said layer.

The use of the adjective "scattering" to describe the substrate and, where appropriate, the sheet of glass or the layer comprising a vitreous material is preferably intended to mean that the haze is at least 40%, in particular 50%, and even 60% or 70%, or even 80%. The haze, sometimes called "blur", is measured using a haze-meter according to standard ASTM D1003.

The layer comprising a vitreous material is advantageously coated with an electrically conductive layer. The latter is preferably in direct contact with the layer comprising a vitreous material, or, where appropriate, with the planarization layer or the barrier layer. The electrically conductive layer is preferably based on a transparent conductive oxide (TCO), such as, for example, indium tin oxide (ITO). Other conducting materials are possible, for example layers of silver or else conductive polymers.

The scattering substrate may thus comprise (or consist of), by way of examples:

- a non-scattering sheet of glass, then a scattering layer consisting of the vitreous material and of scattering elements, then (optionally) a planarization layer, then (optionally) a barrier layer, and, finally, an electrically conductive layer, each layer mentioned being in direct contact with the layer which precedes it and the layer which follows it,
- a non-scattering sheet of glass, then a scattering layer, then a layer consisting of the vitreous material, then (optionally) a barrier layer, and, finally, an electrically conductive layer, each layer mentioned being in direct contact with the layer which precedes it and the layer which follows it,
- a scattering sheet of glass, then a layer consisting of the vitreous material, then (optionally) a barrier layer, and, finally, an electrically conductive layer, each layer mentioned being in direct contact with the layer which precedes it and the layer which follows it.

In the device having an organic light-emitting diode according to the invention, the sheet of glass coated with the layer comprising a vitreous material and with the electrically conductive layer (acting as first electrode) is combined with an organic light-emitting system in the form of at least one layer of organic material, itself coated with an electrically conductive layer acting as second electrode. The organic light-emitting system is therefore located between the substrate and the second electrode, in direct contact with the first and the second electrode.

The light-emitting system is preferably composed of several layers: hole injection layer (for example of polyethylene dioxythiophene doped with polystyrenesulfonic acid or of copper phthalocyanine), hole transport layer (for example of triphenylamine derivatives), emission layer (for example of metal complexes of quinoline derivatives), electron transport layer (for example of oxadiazole derivatives, triazole derivatives, bathophenanthroline derivatives, etc.), electron injection layer (for example of lithium or cesium), etc.

The OLED device according to the invention is preferably used as a source of polychromatic illumination, in particular of white light. It is preferably a bottom emission device, in the sense that the light is emitted through the sheet of glass. In this case, the second electrode consists of a reflecting material, for example a metal film, in particular of aluminum, of silver, of magnesium, etc.

Preferably, the OLED device thus successively comprises a sheet of glass, a layer comprising a vitreous material, optionally a barrier or planarization layer, an electrically conductive layer (typically of ITO), a light-emitting system composed of several layers and a reflecting electrode.

The glass frit according to the invention is preferably obtained by melting starting materials and then forming frit. The starting materials (oxides, carbonates, etc.) can be melted at temperatures of about 950 to 1100° C., and then the glass obtained can be cast, for example rolled between two rolls. The glass obtained can then be ground, for example in a ball mill, a jet mill, a bead mill, or an attrition mill.

The glass frit is preferably in the form of particles of which the $d_{90}$ is at most 10 μm, in particular 5 μm, or even 4 μm. The particle diameter distribution can be determined using a laser particle size analyzer.

The layer comprising a vitreous material is preferably obtained by means of a process wherein:
  the glass frit according to the invention is mixed with an organic medium so as to form a paste,
  said paste is deposited on the sheet of glass,
  the whole assembly is fired.

The organic medium is typically chosen from alcohols, glycols, and terpineol esters. The weight proportion of medium is preferably included in a range of from 10% to 50%.

The depositing of the paste can be carried out in particular by screen printing, by roll coating, by dip coating, by knife coating, by spraying, by spin coating, by flow coating or else by slot die coating.

In the case of screen printing, a screen having a textile or metal mesh, flow coating tools and a doctor blade are preferably used, the thickness being controlled by the choice of the mesh of the screen and its tension, by the choice of the distance between the sheet of glass and the screen, and by the pressure and speed of movement of the doctor blade. The deposits are typically dried at a temperature of 100 to 150° C. by infrared or ultraviolet radiation depending on the nature of the medium.

The firing is preferably carried out in a furnace at a temperature included in a range of from 500 to 600° C., in particular from 510 to 580° C.

The electrically conductive layer may be deposited by various techniques for depositing thin layers, such as, for example, the sputtering, in particular magnetron sputtering (magnetron process), chemical vapor deposition (CVD), in particular plasma-enhanced chemical vapor deposition (PECVD, APPECVD), or else liquid deposition techniques.

The examples which follow illustrate the invention in a nonlimiting manner.

FIRST SERIES OF EXAMPLES

Various glass frits were obtained by melting starting materials. To do this, the starting materials sufficient to obtain 300 g of glass were brought to a temperature of 1000° C. for 1 h 30 in crucibles, heated by Joule effect, of 400 cm³.

Tables 3, 4 and 5 summarize the results obtained. The following are indicated in these tables:
  the chemical composition of the frit (as weight percentage of oxide),
  the glass transition temperature, denoted "Tg" and expressed in ° C.,
  the crystallization temperature, denoted $T_x$ and expressed in ° C.,
  the linear thermal expansion coefficient, denoted α and expressed in $10^{-7}/K$,
  the refractive index for a wavelength of 550 nm, denoted n, measured by ellipsometry,
  the light absorption for a thickness of 3 mm, denoted AL, measured by spectrophotometry,
  the leaching of bismuth in acidic medium, denoted L and expressed in mg/l.

Like the Tg, the $T_x$ is measured by differential scanning calorimetry.

The bismuth leaching was measured by immersing glass substrates coated with a layer of the vitreous material studied in an acidic solution. To do this, layers 10 μm thick were deposited by screen printing on soda-lime-silica glass substrates, using frits having a d90 of 3.4 μm and a d50 of 1.7 μm. The acidic solution is an acetic acid-based solution sold under the reference Neutrax by the company Franklab, diluted to 1.3% by volume in deionized water in order to achieve a pH of 3. The samples were immersed in this solution at a temperature of 50° C. for one hour, and a small amount of solution was removed every 10 minutes and then analyzed in order to deduce therefrom the amount of $Bi_2O_3$ having passed into solution. The number indicated in the tables corresponds to the concentration of $Bi_2O_3$ in the attack solution after 10 minutes.

Examples 1 to 10 (tables 3 and 4) are examples according to the invention, while examples C1 to C6 are comparative examples.

TABLE 3

|  | 1 | 2 | 3 | 4 | 5 |
|---|---|---|---|---|---|
| $Bi_2O_3$ | 73.1 | 74.5 | 73.7 | 72.3 | 72.4 |
| ZnO | 5.54 | 5.31 | 5.39 | 9.34 | 7.9 |
| $SiO_2$ | 7.9 | 7.7 | 7.9 | 7.6 | 9.4 |
| $B_2O_3$ | 7.71 | 7.8 | 7.74 | 6.31 | 6.86 |
| $Al_2O_3$ | 2.5 | 2.5 | 2.4 | 2.4 | 2.5 |
| $Na_2O$ | 0.1 | 0.11 | 0.11 | 0.1 | 0.08 |
| CaO | 3.1 | 0 | 1.7 | 1.9 | 0.04 |
| MgO | 0 | 2 | 1 | 0 | 0 |
| MgO + ZnO | 5.54 | 7.31 | 6.39 | 9.34 | 7.9 |

TABLE 3-continued

|  | 1 | 2 | 3 | 4 | 5 |
|---|---|---|---|---|---|
| MgO + CaO | 3.1 | 2 | 2.7 | 1.9 | 0.04 |
| Tg(° C.) | 460 | 468 | 464 | 456 | 455 |
| $T_x$ (° C.) | 693 |  |  | 678 | 668 |
| $\alpha(10^{-7}/K)$ | 88.7 | 82.2 | 84.2 | 84.9 | 77.5 |
| n | 1.91 | 1.93 | 1.93 | 1.92 | 1.90 |
| AL (%) | 9.4 | 7.3 | 10.3 | 11.1 | 7.4 |
| L (mg/l) | 1.6 | 1.5 | 1.56 | 1.62 | 1.72 |

TABLE 4

|  | 6 | 7 | 8 | 9 | 10 |
|---|---|---|---|---|---|
| $Bi_2O_3$ | 72 | 74.8 | 75.9 | 77.2 | 77 |
| ZnO | 4.87 | 2.68 | 0.08 | 4.51 | 2.51 |
| $SiO_2$ | 11.4 | 9.2 | 8.4 | 7.8 | 7.6 |
| $B_2O_3$ | 8.37 | 8.36 | 10.4 | 6.18 | 9.46 |
| $Al_2O_3$ | 2.7 | 2.7 | 2.6 | 2.3 | 2.4 |
| $Na_2O$ | 0.09 | 0.08 | 0.09 | 0.09 | 0.09 |
| CaO | 0 | 0 | 0 | 0 | 0 |
| MgO | 0 | 2.1 | 2.1 | 1.9 | 1 |
| MgO + ZnO | 4.87 | 4.78 | 2.18 | 6.41 | 3.51 |
| MgO + CaO | 0 | 2.1 | 2.1 | 1.9 | 1 |
| Tg(° C.) | 457 | 475 | 478 | 475 | 458 |
| $T_x$ (° C.) | 682 | 678 | 683 | 677 | 668 |
| $\alpha(10^{-7}/K)$ | 76.9 | 77.1 | 86.4 | 77.2 | 82.9 |
| AL (%) | 8.3 | 10.5 | 8.5 | 7.3 | 8.1 |
| n | 1.89 | 1.91 | 1.89 | 1.96 | 1.92 |
| L (mg/l) | 1.48 | 1.52 | 1.42 | 1.76 | 1.7 |

TABLE 5

|  | C1 | C2 | C3 | C4 | C5 | C6 |
|---|---|---|---|---|---|---|
| $Bi_2O_3$ | 71.9 | 72.7 | 72.5 | 72.2 | 72.3 | 70 |
| ZnO | 10.7 | 10.7 | 10.4 | 9.87 | 9.23 | 10 |
| $SiO_2$ | 7.8 | 7.6 | 7.6 | 7.6 | 7.8 | 7 |
| $B_2O_3$ | 5.62 | 5.7 | 5.8 | 6.58 | 6.29 | 9 |
| $Al_2O_3$ | 2.5 | 2.4 | 2.4 | 2.5 | 2.6 | 3 |
| $Na_2O$ | 0.1 | 0.09 | 0.11 | 0.1 | 0.1 | 1 |
| CaO | 1.4 | 0 | 0.7 | 0 | 1 | 0 |
| MgO | 0 | 0.9 | 0.4 | 1.2 | 0.6 | 0 |
| MgO + ZnO | 10.7 | 11.6 | 10.8 | 11.07 | 9.83 | 10 |
| MgO + CaO | 1.4 | 0.9 | 1.1 | 1.2 | 1.6 | 0 |
| AL (%) | 24.5 | 28.6 | 22.4 | 22.9 | 15.8 | — |
| L (mg/l) | — | — | — | — | — | 1.9 |

Comparative examples C1 to C5 devitrify too easily to be able to be formed into vitreous material, hence their very high light absorption. The examples according to the invention all exhibit a resistance to acids that is significantly better than that of comparative example C6.

Second Series of Examples

Other glasses according to the invention were obtained by melting, as in the case of the first series of examples. The chemical composition thereof is indicated in table 6 hereinafter.

The resistance to acids of these glasses was evaluated on the bulk glass samples. The samples, all having the same surface area, were immersed in the same attack solution as that described previously, for a period of 18 hours. The loss of mass of the sample, expressed in mg/cm² is called "Ma" in table 6. The loss of mass in the case of the comparative glass C6 is 15 mg/cm².

The resistance to bases was also evaluated by measuring the loss of mass (denoted "Mb") obtained having immersed the samples in a solution at pH 11 (solution, diluted to 1%, of the concentrate sold by the company Borer under the brand Deconex® PV 110) for 18 h at 50° C.

TABLE 6

|  | 11 | 12 | 13 | 14 | 15 |
|---|---|---|---|---|---|
| $Bi_2O_3$ | 77.8 | 74.0 | 75.1 | 70.6 | 78.6 |
| ZnO | 0 | 0 | 0 | 0 | 0 |
| $SiO_2$ | 10.5 | 11.0 | 10.2 | 10.8 | 10.1 |
| $B_2O_3$ | 9.5 | 7.4 | 6.8 | 10.4 | 7.7 |
| $Al_2O_3$ | 2.0 | 5.4 | 5.0 | 3.4 | 2.7 |
| $Na_2O$ | 0 | 0.1 | 0.1 | 0.1 | 0.1 |
| CaO | 0 | 0 | 0 | 4.7 | 0 |
| $TiO_2$ | 0 | 2.1 | 0 | 0 | 0 |
| $SnO_2$ | 0 | 0 | 0 | 0 | 0.8 |
| $Sb_2O_3$ | 0 | 0 | 2.9 | 0 | 0 |
| Ma (mg/cm²) | 9 | 3.8 | 8 | 14 | 11.6 |
| Mb (mg/cm²) | 4 | 1 | 4 | 8 | 4 |

The invention claimed is:

1. A scattering substrate for a device having an organic light-emitting diode comprising a sheet of glass coated on one of the faces thereof with a layer comprising a vitreous material, such that said vitreous material has a chemical composition comprising the following constituents, which vary within the weight limits defined hereinafter:

| $Bi_2O_3$ | 60-85% |
| $B_2O_3$ | 5-12% |
| $SiO_2$ | 6-10% |
| MgO + ZnO | 0-9.5% |
| $Al_2O_3$ | 0-7 |
| $Li_2O + Na_2O + K_2O$ | 0.02-5% |
| CaO | 0-5% |
| BaO | 0-20%, | wherein a glass transition temperature Tg of glass constituting the vitreous material is in a range from 440 to 480° C.

2. The scattering substrate as claimed in claim 1, wherein the weight content of $Bi_2O_3$ is included in a range of from 65% to 80%.

3. The scattering substrate as claimed in claim 2, wherein the weight content of $Bi_2O_3$ is included in a range of from 68% to 75%.

4. The scattering substrate as claimed in claim 1, wherein the weight content of ZnO is at most 8%.

5. The scattering substrate as claimed in claim 4, wherein the weight content of ZnO is less than 5%.

6. The scattering substrate as claimed in claim 1, wherein the weight content of $SiO_2$ is included in a range of from 7% to 9%.

7. The scattering substrate as claimed in claim 1, wherein the sum of the weight contents of MgO and ZnO is included in a range of from 2% to 9%.

8. The scattering substrate as claimed in claim 1, wherein the sum of the weight contents of CaO and MgO is included in a range of from 0.5% to 4%.

9. The scattering substrate as claimed in claim 1, wherein the chemical composition of the vitreous material comprises the oxides $TiO_2$ and/or $SnO_2$.

10. The scattering substrate as claimed in claim 9, wherein the $TiO_2$ content is at least 0.5% or 1% and at most 5%.

11. The scattering substrate as claimed in claim 10, wherein the $TiO_2$ content is at most 2%.

12. The scattering substrate as claimed in claim 9, wherein the $SnO_2$ content is at least 0.2% or 0.5% and at most 5%.

13. The scattering substrate as claimed in claim 12, wherein the $SnO_2$ content is at most 3%.

14. The scattering substrate as claimed in claim 1, wherein the layer comprising a vitreous material also comprises scattering elements chosen from particles and cavities.

15. The substrate as claimed in claim 14, wherein the particles are chosen from aluminum particles, zirconia particles, silica particles, titanium dioxide particles, calcium carbonate particles and barium sulfate particles.

16. The substrate as claimed in claim 1, wherein the layer comprising a vitreous material consists of said vitreous material, and wherein the sheet of glass scatters light or a scattering layer is placed under the layer comprising a vitreous material.

17. The scattering substrate as claimed in claim 1, wherein an electrically conductive layer is placed on the layer comprising a vitreous material.

18. A device having an organic light-emitting diode, comprising a scattering substrate as claimed in claim 17.

19. The scattering substrate as claimed in claim 1, wherein the sum $Li_2O+Na_2O+K_2O$ is 0.05-5%.

20. The scattering substrate as claimed in claim 1, wherein the weight content of $Al_2O_3$ is 1-4%.

21. The scattering substrate as claimed in claim 19, wherein the only alkali metal oxide present in the chemical composition is $Na_2O$.

22. A glass frit of which the chemical composition comprises the following constituents, which vary within the weight limits defined hereinafter:

| | |
|---|---|
| $Bi_2O_3$ | 65-85% |
| $B_2O_3$ | 5-12% |
| $SiO_2$ | 6-10% |
| $MgO + ZnO$ | 0-9.5% |
| $Al_2O_3$ | 0-5% |
| $Li_2O + Na_2O + K_2O$ | 0.02-5% |
| CaO | 0-5% |
| CaO + MgO | ≥0.5 |
| BaO | 0-20%, | wherein a glass transition temperature Tg of glass constituting the vitreous material is in a range from 440 to 480° C.

23. The glass frit as claimed in claim 22, wherein the sum $Li_2O+Na_2O+K_2O$ is 0.05-5%.

24. The glass frit as claimed in claim 23, wherein the only alkali metal oxide present in the chemical composition is $Na_2O$.

25. The glass frit as claimed in claim 22, wherein the weight content of $SiO_2$ is included in a range of from 7% to 9%.

* * * * *